United States Patent
Kodigala et al.

(10) Patent No.: US 11,675,126 B1
(45) Date of Patent: Jun. 13, 2023

(54) HETEROGENEOUS INTEGRATION OF AN ELECTRO-OPTICAL PLATFORM

(71) Applicant: National Technology & Engineering Solutions of Sandia, LLC, Albuquerque, NM (US)

(72) Inventors: Ashok Kodigala, Albuquerque, NM (US); Anthony L. Lentine, Albuquerque, NM (US); Nicholas Boynton, Albuquerque, NM (US); Douglas Chandler Trotter, Albuquerque, NM (US); Thomas A. Friedmann, Albuquerque, NM (US); Phillip Harrison Weiner, Needham, MA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 69 days.

(21) Appl. No.: 17/221,949

(22) Filed: Apr. 5, 2021

Related U.S. Application Data (60) Provisional application No. 63/005,718, filed on Apr. 6, 2020.

(51) Int. Cl.
  *G02B 6/12* (2006.01)
  *H01S 5/026* (2006.01)
  *H01S 5/02* (2006.01)

(52) U.S. Cl.
  CPC ............. *G02B 6/12* (2013.01); *H01S 5/021* (2013.01); *H01S 5/026* (2013.01); *G02B 2006/1204* (2013.01); *G02B 2006/12121* (2013.01)

(58) Field of Classification Search
  None
  See application file for complete search history.

(56) References Cited

U.S. PATENT DOCUMENTS

| | | | |
|---|---|---|---|
| 6,853,671 B2 | 2/2005 | Liu et al. | |
| 7,257,283 B1 | 8/2007 | Liu et al. | |
| 8,767,792 B2 | 7/2014 | Bowers et al. | |
| 2019/0129097 A1* | 5/2019 | Liu | G02B 6/136 |
| 2021/0116637 A1* | 4/2021 | Li | G02B 6/12004 |

OTHER PUBLICATIONS

Zhou, Z. et al., "On-Chip Light Sources for Silicon Photonics," Light: Science and Applications, 2015, vol. 4, pp. 1-13.
Park, H. et al.,, "Photonic Integration on the Hybrid Silicon Evanescent Device Platform," Advances in Optical Technologies 2008, pp. 1-17.

(Continued)

*Primary Examiner* — Chad H Smith
(74) *Attorney, Agent, or Firm* — Martin I. Finston; Mark A. Dodd (57) ABSTRACT

A hybrid photonic integrated circuit and a method of its manufacture are provided. A SiP functional layer is fabricated on an SOI wafer. A lithium niobate thin film is bonded to the SiP functional layer. The silicon handle layer is removed from the SOI wafer to expose buried oxide, and at least one III-V die is bonded to the exposed buried oxide. In embodiments, at least one waveguiding component is fabricated in the SiP functional layer. In embodiments, the SiP functional layer comprises a top waveguiding layer.

16 Claims, 9 Drawing Sheets

(56) References Cited

OTHER PUBLICATIONS

Kittlaus, E.A et al., "Non-Reciprocal Interband Brillouin Modulation", Nature Photonics, 2018, vol. 12, pp. 613-619.

Doer, C. R. et al., "Silicon Photonics Broadband Modulation-Based Isolator", Optics Express, 2014, vol. 22, pp. 4493-4498.

Zhang, C. et al., "Thermal Management of Hybrid Silicon Ring Lasers for High Temperature Operation", IEEE Journal of Selectec Topics in Quantum Electronics, 2015, vol. 21, 1502607.

Boynton, N. et al., "A Heterogeneously Integrated Silicon Photonic/Lithium Niobate Travelling Wave Electro-Optic Modulator", Optics Express, 2020, vol. 28, pp. 1868-1884.

Weigel, P. O. et. al., "Bonded Thin Film Lithium Niobate Modulator on a silicon Photonics Platform Exceeding 100 GHz 3-dB Electrical Modulation Bandwidth," Optic Express, 2018, vol. 26, pp. 23728-23739.

Wang, X. et. al., "Achieving Beyond-100-GHz Large-Signal Modulation Bandwidth in Hybrid Silicon Photonics Mach Zehnder Modulators using Thin Film Lithium Niobate" APL Photonics, 2019, vol. 4, 096101.

Berry, S. A. et. al., "Zn-Indiffused Diced Ridge Waveguides in MgO:PPLN Generating 1 watt 780 nm SHG at 70% Efficiency," OSA Continuum, 2019, vol. 2, pp. 3456-3464.

Hsu, C.-W. et. al., "Efficient, Watt-Level Frequency Doubling and Optical Parametric Amplification on Periodically Poled Lithium Niobate Ridge Waveguide", Proceedings of SPIE. LASE, 2019, vol. 10902, 109020D.

Du, Wan-Ying et. al., "Note: Electro-Optic Coefficients of Li-Deficient MgO-Doped LiNbO3 Crystal" Review of Scientific Instruments, 2016, vol. 87, 096105.

Derose, C. T. et. al., "Ultra Compact 45 GHz CMOS Compatible Germanium Waveguide Photodiode with Low Dark Current," Optic Express, 2011, vol. 19, pp. 24897-24904.

Thiessen, Torrey et al., "Backside-Processed III-V-on-Silicon Discrete Mode Laser," CLEO 2019, Optical Society of America.

Rao, A. et al., "High-Performance and Linear Thin-Film Lithium Niobate Mach-Zehnder modulators on silicon up to 50 GHz", Optics Letters, 2016, vol. 41, pp. 5700-5703.

Weigel, P.O. et al., "Lightwave Circuits in Lithium Niobate through Hybrid Waveguides with Silicon Photonics," Mature Scientific Reports, 2016, vol. 6, 22301 | DOI: 10.1038/srep22301.

Suzuki, J. et al., "Highly Efficient Double-Taper-Type Coupler between III-V/Silicon-on-Insulator Hybrid Device and Silicon Waveguide," Japanese Journal of Applied Physics, 2018, vol. 57, 094101.

Hayashi, Y. et al., "GaInAsP/Silicon-on-Insulator Hybrid Laser with Ring-Resonator-Type Reflector Fabricated by $N_2$ Plasma-Activated Bonding," Japanese Journal of Applied Physics, 2016, vol. 55, 082701.

Kurczveil, G. et al., "Characterization of Insertion Loss and Back Reflection in Passive Hybrid Silicon Tapers," IEEE Photonics Journal, 2013, vol. 5, 6600410.

Fang, K. et al., "Realizing Effective Magnetic Field for Photons by Controlling the Phase of Dynamic Modulation," Nature Photonics, 2012, vol. 6. pp. 782-787.

\* cited by examiner

FIG. 5 (SLIDE 6)

FIG. 6 (SLIDE 7)

FIG. 7 (SLIDE 8)

FIG. 8 (SLIDE 9)

FIG. 9 (SLIDE 13)

FIG. 10 (SLIDE 18)

FIG. 11 (SLIDE 19)

FIG. 12 (SLIDE 22)

FIG. 13 (SLIDE 23)

FIG. 16 (SLIDE 20)

(a) Deposit Oxide
FIG. 17A

(b) Deposit Nitride
FIG. 17B

(c) Deposit More Oxide (B), CMP
FIG. 17C

(d) Complete Si Photonics flow up to oxide/CMP after si etch
FIG. 17D

(e) Flip nitride and wafer bond to SOI
FIG. 17E

(f) Remove Superstrate
FIG. 17F (g) Remove Oxide (A)
FIG. 17G (h) Etch Nitride
FIG. 17H (i) Continue SiP flow ...
FIG. 17I

HETEROGENEOUS INTEGRATION OF AN ELECTRO-OPTICAL PLATFORM

CROSS-REFERENCE TO RELATED APPLICATION

This application claims the benefit of U.S. Provisional Application No. 63/005,718, filed Apr. 6, 2020, the entirety of which is hereby incorporated herein by reference.

ACKNOWLEDGEMENT OF GOVERNMENT SUPPORT

This invention was made with United States Government support under Contract No. DE-NA0003525 between National Technology & Engineering Solutions of Sandia, LLC and the United States Department of Energy/National Nuclear Security Administration. The United States Government has certain rights in this invention.

FIELD OF THE INVENTION

The invention relates to electro-optical semiconductor devices and methods for their manufacture. More particularly, it relates to methods of heterogeneous integration and to heterogeneously integrated silicon photonics platforms.

ART BACKGROUND

Photonic integrated circuits (PICs) are gaining in importance for applications such as optical fiber communication and photonic computing. The technology of PICs is supported by several different platforms, one of which is the silicon photonics (SiP) platform.

The SiP platform has a proven ability to support complex multichannel PICs. These integrated circuits may include devices such as modulators and photodiodes. SiP circuits have the important advantage that they are manufacturable by CMOS processes, so that the infrastructure that has already been developed to build CMOS electronics can be used for their production as well. For the same reason, SiP circuits can be monolithically integrated with CMOS electronics, which is an additional advantage.

However, purely silicon-based PICs, and even PICs that include germanium photodetectors, do not offer the full range of functionality that would be desirable for many applications. For example, light sources and other optoelectronic devices based on III-V semiconductor materials are highly desirable for their efficiency and range of accessible wavelengths. III-V devices, however, are not manufacturable by CMOS processes.

One critically important function is optical modulation. CMOS-manufacturable, monolithic SiP modulators have been demonstrated. In examples, these modulators operate through the plasma dispersion effect in which the refractive index of silicon is modulated by changing the carrier density within a waveguide core.

Although useful, these modulators have certain limitations. For example, the modulation bandwidth of these modulators is fundamentally limited by the mobility of the carriers within the silicon. Also, this method of modulation is nonlinear, which is disadvantageous for at least some applications. Further, silicon is susceptible to two-photon absorption, which limits the power handling capability of silicon waveguides. This could limit the usefulness of such silicon-based modulators for some applications, for example in radio-frequency photonics.

Designers in the field of optoelectronics have turned to lithium niobate (LN) as an alternative modulator material that can potentially offer greater modulation bandwidth and handle more optical power than silicon. Because LN has a very high electro-optic coefficient, it can provide effective modulation at relatively low voltages applied over relatively short distances.

It would be advantageous to combine LN-based modulation with the convenience and versatility of a SiP platform. In practice, however, this has proven difficult because the technology for LN processing is incompatible with CMOS processing. This has required LN-based devices and SiP devices to be manufactured in different plants.

Certain advances in heterogeneous integration have helped to alleviate this problem. ("Heterogeneous integration" or "heterointegration" is the technology of combining separately manufactured components on a single chip, where they have complementary functions in the functionality of the chip as a whole.)

For example, Peter O. Weigel et al., "Lightwave Circuits in Lithium Niobate through Hybrid Waveguides with Silicon Photonics," *Nature Scientific Reports* (Mar. 1, 2016), 6:22301 | DOI: 10.1038/srep22301, hereinafter cited as "Weigel (2016)", reported a photonic waveguide technology based on a two-material core, in which a submicrometer-thickness patterned layer of silicon is bonded to a submicrometer-thickness layer of unpatterned, single-crystalline, thin-film LN (TFLN), and light is coupled between the two layers. The entirety of Weigel (2016) is hereby incorporated herein by reference.

Further progress was reported in Peter O. Weigel et al., "Bonded thin film lithium niobate modulator on a silicon photonics platform exceeding 100 GHz 3-dB electrical modulation bandwidth," *Optics Express* 26 (Sep. 3, 2018) 23728-23739, hereinafter cited as "Weigel (2018)".

There, the authors reported a Mach-Zehnder electro-optic modulator (EOM) in which unpatterned TFLN was oxide-bonded at 200° C. to a SiP platform that included features for optical input/output, directional coupling, and curvilinear routing. The 3-dB electrical modulation bandwidth reported for the resulting hybrid device was greater than 106 GHz. The entirety of Weigel (2018) is hereby incorporated herein by reference.

Still further progress was reported in Nicholas Boynton et al., "A heterogeneously integrated silicon photonic/lithium niobate travelling wave electro-optic modulator," *Opt. Express* 28 (2020) 1868-1884, hereinafter cited as "Boynton (2020)". The entirety of Boynton (2020) is hereby incorporated herein by reference. Aspects of the work reported in Boynton (2020) are also disclosed in U.S. Pat. No. 10,788,689, the entirety of which is hereby incorporated herein by reference.

Boynton (2020) reported on a heterointegrated EOM in which an unpatterned, thin LN film is bonded to a SiP circuit. A prototype achieved a 3-dB electro-optic bandwidth of about 30 GHz. An important feature of the architecture reported in Boynton (2020) was that up to the bonding of the LN, the device could be fabricated entirely within a CMOS manufacturing plant. An LN die could then be diced from a TFLN wafer and bonded to the SiP circuit.

The CMOS-compatible portion of the PIC reported in Boynton (2020) also included silicon nitride waveguides. Silicon nitride is a desirable waveguide material because it can provide relatively efficient coupling to optical fiber, and it can support greater optical power than silicon, while still amenable to monolithic integration with CMOS electronics.

The approach of Boynton (2020) is promising because it simplifies the fabrication of TFLN devices and systems, and because it addresses the material limitations of silicon with respect to modulation and power handling capacity. However, it leaves room for improvement in several respects. For example, it does not, in and of itself, address the problem of how to add III-V devices to the heterointegrated system. Further, it would be desirable to improve the optical performance of the bonded TFLN by reducing optical loss and undesired reflections.

SUMMARY OF THE INVENTION

We have devised a method for heterogenous integration of silicon photonics materials such as silicon, silicon nitride, germanium, and aluminum nitride with electro-optical LN as well as with III-V semiconductor materials. Our method makes it possible to integrate active silicon photonics not only with LN for electro-optical processing, but also with active III-V devices. Further heterointegration on the same photonics integrated circuit may be possible by adding devices based, for example, on YIG or other magneto-optic materials.

One advantage of such an extensively heterointegrated platform is that complementary functionalities from each of the various material systems can be combined in a single, compact package. For example, III-V can serve as lasers and hybrid optical amplifiers. The LN layer can provide high-performance optical modulation and, potentially, nonlinear optical functionality such as second harmonic generation or sum frequency generation. Photodetectors using germanium or silicon-germanium can be integrated in the SiP layer, and photodetectors using III-V materials can be integrated in the III-V layer.

In embodiments of our new method, LN is bonded to the SiP circuit in the form of a thin film that spans the entire substrate. We found that this offered advantages over die-bonding a chip of LN that has been cut to size onto the SiP wafer. By bonding a wafer-scale LN layer, we were able to reduce optical loss and unwanted reflections.

In an example of our approach, an SOI wafer is fully processed with SiP functionality on the active side, which is opposite to the silicon substrate. The active side of the resulting SiP circuit is flip-bonded to the LN film. The silicon substrate of the SiP circuit is then selectively removed, leaving a smooth interface for bonding of a III-V epitaxial wafer. The bonded III-V wafer is then processed to define lasers, amplifiers, or other devices.

Devices of other material systems, such as magneto-optic materials, can potentially be die-bonded to the wafer during the III-V processing.

Accordingly, the invention in a first aspect relates to a method for fabricating a hybrid photonic integrated circuit. According to the disclosed method, an SOI wafer is provided. The SOI wafer has a top silicon layer, a buried oxide (BOX) layer, and a silicon handle layer. An SiP functional layer is fabricated on the SOI wafer, including at least one fabricated waveguiding component. In some embodiments, at least one waveguiding component is fabricated in the top silicon layer.

A lithium-niobate-on-insulator (LNOI) wafer or wafer portion is provided. The LNOI wafer or wafer portion has a silicon handle and a lithium niobate (LN) thin film. The LN thin film is bonded to the SOI wafer. The silicon handle layer is removed from the SOI wafer so as to expose a back face of the BOX layer. At least one III-V die is bonded to the exposed back face of the BOX layer.

In some embodiments, a protective oxide layer is formed over the SiP layer before the LNOI wafer is bonded to the SOI wafer. In examples, the protective oxide layer is formed by chemical deposition of silicon dioxide, followed by chemical-mechanical polishing. The LN thin film is then bonded directly to the protective oxide layer.

In embodiments, the processing of the SOI layer comprises fabricating at least one active device. Example devices include germanium photodetectors.

In embodiments, after the bonding of at least one III-V die, at least one III-V die is processed to fabricate an active device.

In embodiments, the processing of the SOI wafer comprises adding at least one waveguiding layer of silicon nitride (SiN) to the SOI wafer. In some embodiments, at least one SiN layer is added by growing it in situ. In some embodiments, at least one SiN layer is added by bonding it. In some embodiments, SiN layers are added both by in situ growth and by bonding.

In some embodiments, processing the SOI wafer includes forming at least one first SiN waveguide at a first vertical level within an optical coupling distance of the LN thin film. The processing may further include forming at least one second SiN waveguide at a second vertical level more distant from the LN thin film than the first vertical level.

In embodiments, at least one third SiN waveguide is formed at a third vertical level even more distant from the LN thin film than the first and second levels. In some of those embodiments, at least one second SiN waveguide is formed within an optical coupling distance both of at least one first SiN waveguide and of at least one third SiN waveguide, so as to optically couple the first and third SiN waveguides to each other.

In embodiments, the processing of the SOI wafer comprises etching at least one via and filling it with metal to provide a thermal shunt. The shunts are formed, for example, in a conformation that extends from over an active III-V device, down to or down into the silicon handle of the LN thin film. In embodiments, the via for the thermal shunt is etched down to the silicon handle of the LNOI wafer, and it may be etched partway into the silicon handle.

In embodiments, the LN thin film is patterned before the LNOI wafer is bonded to the SOI wafer.

In embodiments, the bonding of the LNOI wafer to the SOI wafer is performed with an intact LN thin film, i.e., a film that has not been physically modified.

In embodiments, before the via openings for the thermal shunts are filled with metal, a mold of silicon dioxide is formed for deposition of the thermal shunts, seed metal is deposited in the mold, and metal fill is electrodeposited over the seed metal to fill the via openings.

The invention in a second aspect relates to a hybrid photonic integrated circuit in which a SiP functional layer comprises a top silicon layer, a layer of buried oxide, and at least one optical or optoelectronic component formed in the top silicon layer, and comprises at least one SiP waveguiding component. A thin film of lithium niobate backed by a silicon handle is bonded to the SiP functional layer. At least one III-V die is bonded to the SiP layer of buried oxide in an arrangement in which the thin film of lithium niobate and the III-V die are positioned on opposing sides of the SiP functional layer.

In embodiments, at least one SiP waveguiding component is optically coupled to the thin film of lithium niobate, and wherein at least one SiP waveguiding component is optically coupled to a III-V die.

In embodiments, at least one III-V die is optically coupled to a waveguiding component formed in the top silicon layer so as to support a hybrid optical mode that is partly confined in III-V material and partly confined in silicon.

In embodiments, the SiP functional layer comprises one or more waveguiding layers additional to the top silicon layer, and at least one additional waveguiding layer is optically coupled to the thin film of lithium niobate so as to support a hybrid optical mode.

In embodiments, the SiP functional layer comprises one or more silicon nitride waveguiding layers, and a waveguiding component formed in at least one of the silicon nitride waveguiding layers is optically coupled to the thin film of lithium niobate so as to support a hybrid optical mode that is confined partly in the thin film of lithium niobate and partly in the silicon nitride waveguiding component.

In embodiments, the SiP functional layer comprises at least two silicon nitride waveguiding layers situated at different vertical levels within the SiP functional layer. A waveguiding component in one of these silicon nitride layers supports a hybrid optical mode with the thin film of lithium niobate. Another of these silicon nitride layers lies at a vertical level between the first silicon nitride waveguiding layer and the top silicon layer, and it comprises at least one waveguiding component that is optically coupled both to a waveguiding component formed in the first silicon nitride waveguiding layer and to a waveguiding component formed in the top silicon layer.

In embodiments, at least one active III-V device is bonded to the SiP layer of buried oxide. In some embodiments, a thermal shunt extends from over the active III-V device, through the SiP functional layer, and down to or down into the silicon handle of the lithium niobate thin film.

In embodiments, the SiP functional layer comprises at least one germanium photodetector.

The invention in a third aspect relates to a hybrid photonic integrated circuit in which a SiP functional layer comprises a top waveguiding layer and a layer of buried oxide, and comprises one or more SiP waveguiding components. A thin film of lithium niobate backed by a silicon handle is bonded to the SiP functional layer. At least one III-V die is bonded to the SiP layer of buried oxide in an arrangement in which the thin film of lithium niobate and the III-V die are positioned on opposing sides of the SiP functional layer.

DETAILED DESCRIPTION

Our approach makes it possible to combine high efficiency III-V lasers and optical amplifiers with thin-film lithium niobate (TFLN) modulators or other TFLN devices on a hybrid silicon photonics integrated circuit. Through optical coupling to waveguides embedded in the SiP functional layer, the SiP functionality interacts both with the TFLN devices and the III-V devices.

More specifically, waveguides at two or more levels are incorporated in the SiP functional layer. One SiP waveguide level is situated nearest the TFLN functional layer and is optically coupled directly to it. Another SiP waveguide level is situated nearest the III-V functional layer and is optically coupled directly to at least one III-V device or III-V waveguide. One or more intermediate waveguide levels may facilitate optical coupling between the SiP waveguides nearest the TFLN functional layer and the SiP waveguides nearest the III-V functional layer. As a consequence, there is support for full photonic integration among the TFLN, SiP, and III-V functional layers.

Thin-film lithium niobate modulators bonded onto SiP substrates are known in the art. Publications that may be of interest in this regard include Weigel (2016), Weigel (2018), and Boynton (2020), each of which was cited above. Another publication that may be of interest in this regard is A. Rao et al., "High-performance and linear thin-film lithium niobate Mach-Zehnder modulators on silicon up to 50 GHz," *Optics Letters* 41 (2016) 5700-5703, the entirety of which is hereby incorporated herein by reference.

The use of tapered waveguides for optical coupling between the silicon layer and the III-V layer in a hybrid device is well known in the art. Publications that may be of interest in this regard include the following, each of which is hereby incorporated herein in entirety:

J. Suzuki et al., "Highly efficient double-taper-type coupler between III-V/silicon-on-insulator hybrid device and silicon waveguide," *Japanese Journal of Applied Physics* 57, 094101 (2018);

Y. Hayashi et al., "GaInAsP/silicon-on-insulator hybrid laser with ring-resonator type reflector fabricated by N2 plasma-activated bonding," *Japanese Journal of Applied Physics* 55, 082701 (2016); and G. Kurczveil et al., "Characterization of Insertion Loss and Back Reflection in Passive Hybrid Silicon Tapers," *IEEE Photonics Journal* 5, 6600410 (2013).

By way of example, embodiments of our approach can employ adiabatic double tapers for efficient coupling across the SiP-III-V interface. A structure of this kind involves two typically linear tapers with different step heights designed for adiabatic and efficient transition of the mode.

Figure 1:
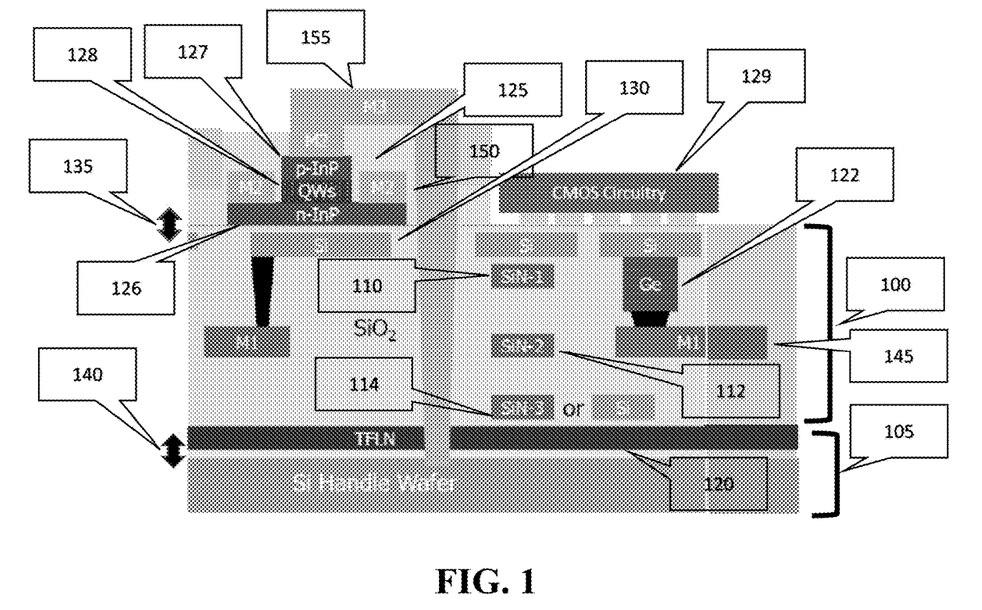
FIG. 1 is a cross-sectional cartoon drawing showing the integration of a fully processed silicon photonic SOI wafer, including electro-optical devices flip-bonded to a lithium niobate wafer.

A cross-section of a completed integrated circuit is shown notionally in FIG. 1 in an illustrative example. Our illustrative example has been designed to support an operating wavelength of 1.55 µm. However, suitable modifications can be made to support any operating wavelength within a broad range, by techniques well known in the art. For example, our design studies predict that comparable performance can be obtained in a suitably modified design operating at 1.31 µm.

Turning to FIG. 1, it will be seen that SiP functional layer 100 is embodied in a processed silicon photonics wafer which may be, for example, a 200-mm SOI wafer. The SiP wafer is inverted and bonded to a carrier wafer 105. To support optical modulation, the carrier wafer is a TFLN substrate. The silicon photonics wafer includes layers 110, 112, 114 of silicon nitride waveguides to access the LN electro-optic layer 120.

Silicon photonic components can include carrier depletion Mach-Zehnder modulators (MZM), ring modulators, switches, tunable/fixed ring resonators, arrayed waveguide grating (AWG) filters, PIN and avalanche photodetectors in germanium, as well as passive components such as splitters, waveguides, polarization rotation devices and gratings for reflectors and vertical couplers.

By way of example, a germanium photodetector 122 is shown in the figure.

Epitaxial III-V material is bonded, and devices 125 such as lasers and optical amplifiers are fabricated in the III-V material. The bonding is effectuated by removing the original substrate of the SiP wafer to provide a clean surface for dielectric bonding of the III-V material.

Evanescent coupling to a silicon waveguide 130 near the bond provides optical access.

Double arrows 135, 140 indicate the SiP-TFLN bonding site and the SiP-III-V bonding site, respectively.

III-V device 125, exemplified here as a laser, may include, by way of example, an n-type indium phosphide (InP) layer 126, a p-type InP layer 127, and between those layers, a multiple quantum well structure 128.

CMOS circuitry 129 can be added by flip-chip bonding.

The M1 metal layer 145 provides interconnection for the SiP functional layer. The M2 metal layer 150 provides interconnection for the III-V functional layer.

Thermal shunts 155 for conduction of heat from the III-V functional layer to the silicon substrate of the TFLN carrier wafer are formed in the M3 metal layer.

A typical thickness for the silicon waveguides 130 is 230 nm. However, because the silicon refractive index is low relative to the III-V material, this thickness may be advantageously increased to, e.g., 500 nm for improved mode confinement control.

Coupling between waveguide layers can be effectuated laterally or through intermediate silicon nitride waveguide layers as shown in the figure. The thicker silicon waveguides can be made by selective silicon epitaxial growth.

Silicon Nitride low-loss waveguides. Silicon nitride (SiN) waveguides grown using PECVD tend to have unwanted absorption, particularly at wavelengths from 1500 nm to 1550 nm. To overcome this, low-loss SiN may be added to the substrate by wafer bonding instead of by in situ growth. Away from the SiP substrate, the silicon nitride material can be grown and annealed at high temperatures, for example temperatures of about 1200° C., to facilitate low material losses.

The SiN waveguides can be patterned either before or after bonding. By way of example, our bonding tool has an equipment accuracy of +/−200 nm.

Transition losses between the silicon layer and the silicon nitride waveguide for our current process have been estimated to be less than 0.1 dB.

Thermal Shunts. At high powers, it could be desirable to thermally heatsink the III-V lasers. In our approach, we can use metal shunts for enhanced thermal conductivity.

Immediately after the contact metallization of the III-V devices, a via is etched through the oxide to the substrate. A LiNbO$_3$ etch step follows. Shunt metal is deposited to fill the via while making sure the electrical contact to silicon is non-ohmic by choice of metals and intrinsic doping of the silicon handle. Shunts may also be extended through the substrate to facilitate even better heat transfer.

Optical Isolators. Isolators are important in the design of optical systems, because any optical amplifier with significant gain will require an isolator to avoid lasing from back reflections. Non-reciprocal isolators are especially advantageous because they provide isolation for all modes; they consequently cannot be defeated by unwanted mode conversion.

It is known to use isolators based on magnetic materials. In previous work, such isolators have been hybrid bonded to silicon waveguides. One drawback of this approach, however, is that the observed insertion loss has been relatively high.

Photonic approaches to isolation offer a known alternative to the approaches based on magnetic materials. Suitable photonic approaches are described, e.g., in C. Doerr et. al., "Silicon photonics broadband modulation-based isolator," *Opt. Express* 22 (2014) 4493-4498, and in K. Fang et al., "Realizing effective magnetic field for photons by controlling the phase of dynamic modulation," *Nature Photon.* 6, 782-787 (2012), the entirety of each of which is hereby incorporated herein by reference.

The photonic approach described in Doerr et al., for example, offers some advantages because it can give broadband isolation in a standard silicon photonics process.

Integrated EO modulators. We have an approach for integrating lithium niobate (LN) modulators on the bottom of the stack by bonding the inverted silicon photonics devices to thin film lithium niobate (TFLN) on silicon substrates, as shown in FIG. 1.

Figure 2:
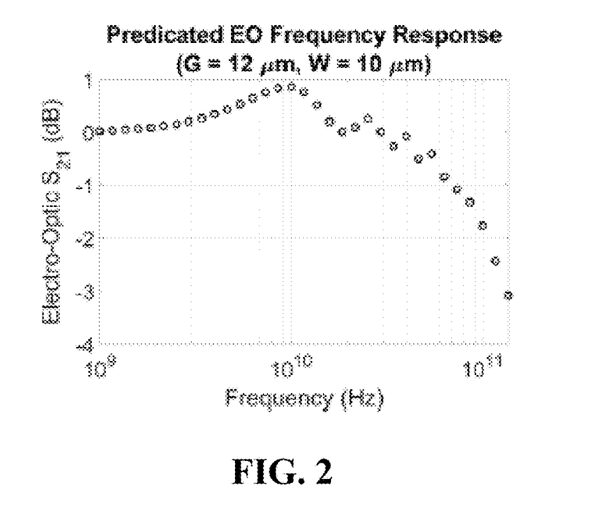
FIG. 2 is a graph showing the theoretically modeled frequency response of a hybrid thin film lithium niobite modulator on silicon nitride waveguides.

Simulations show that this topology can achieve modulation with a 3-dB bandwidth above 130 GHz for a 5 mm long device, as FIG. 2 indicates. In the figure, the coefficient $S_{21}$ is plotted as a function of optical frequency. This coefficient is the radio-frequency scattering parameter that relates the detected optical signal (which is electrical after detection) to the input electrical signal. In the arrangement that was simulated in FIG. 2, the electrodes were in a ground-signal-ground configuration with central electrode width W equal to 12 µm.

In example embodiments, the modulators are fabricated as hybrid Mach-Zehnder modulators in MgO-doped x-cut thin-film LN bonded to the silicon nitride waveguides.

In example embodiments, there may be a total distance on the order of 1400 nm between the SiN-1 silicon nitride layer, which is seen as the top SiN in FIG. 1, and the SiN-3 silicon nitride layer, seen as the bottom SiN in the figure, which supports a hybrid LN-SiN optical mode. Direct coupling between SiN-1 and the hybrid mode over such a great distance would be likely to suffer significant optical loss. However, the optical coupling can be facilitated by the intermediate (SiN-2) silicon nitride layer 112, as shown in FIG. 1. The SiN-2 waveguides are advantageously tapered in thickness to, e.g., 100 nm to facilitate the optical mode coupling.

Figure 3:
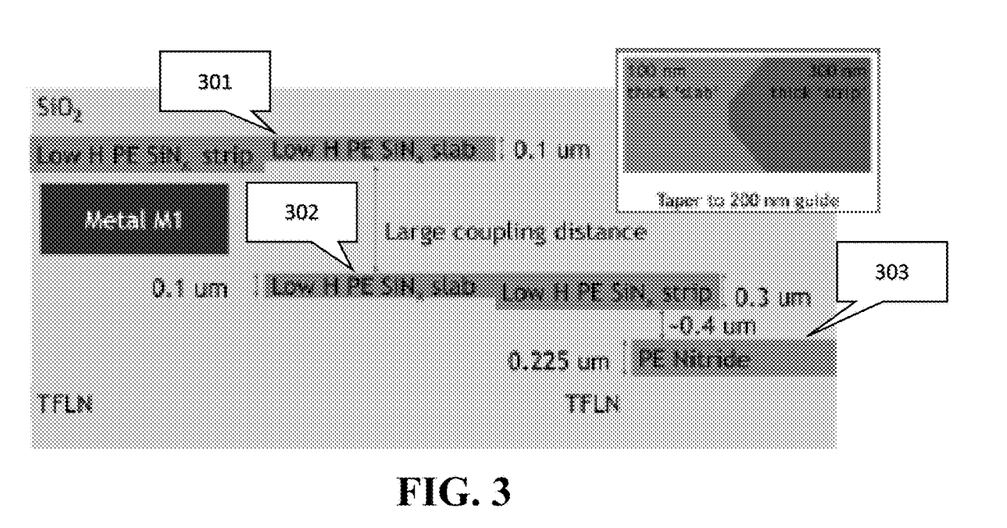
FIG. 3 is a cross-sectional detail of coupling between layers, designed to access a hybrid TFLN/nitride optical mode.

FIG. 3 provides a detail of coupling between layers to access the hybrid TFLN/SiN mode. In the particular example illustrated in the figure, SiN-1 layer 301, SiN-2 layer 302, and SiN-3 layer 303 are deposited by plasma-enhanced chemical vapor deposition (PECVD), with at least the SiN-1 and SiN-2 layers having low hydrogen content. The SiN-1 and SiN-2 layers are step shaped, with a thinner portion 0.1 µm thick and a thicker portion 0.3 µm thick. The inset to the figure shows a taper between the two portions. The SiN-3 layer is 0.225 µm thick.

As seen in the figure, the coupling distance between SiN-1 and SiN-2 is relatively high. The coupling distance between SiN-2 and SiN-3 is about 0.4 µm.

It should be understood that FIG. 3 is a non-limiting example. It is provided to illustrate some possible designs and to illustrate how varying the optical coupling distance may affect the performance of those designs. In a different design approach, for example, all SiN layers may be made 0.1 µm thick.

Figure 4:
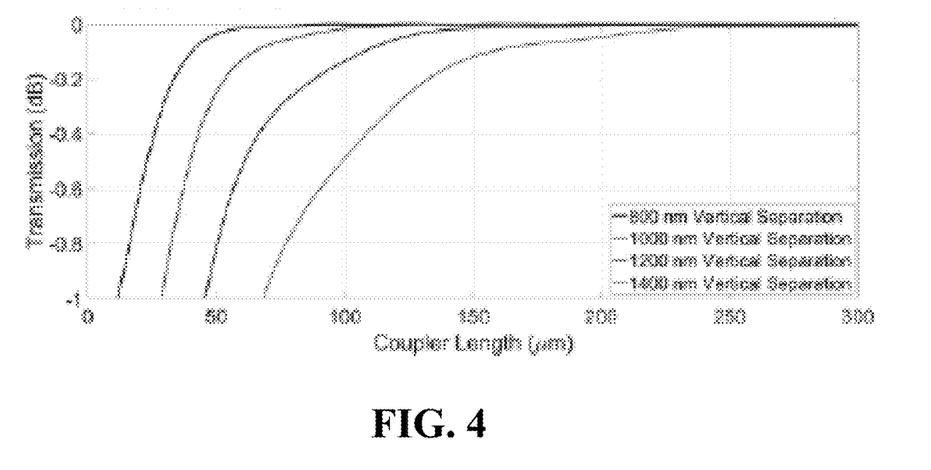
FIG. 4 provides a graph of the theoretically modeled coupling loss between a low-loss silicon nitride layer and a hybrid mode as a function of adiabatic taper length.

FIG. 4 is a graph of transmission versus coupler length, based on theoretical modeling of the arrangement of FIG. 3. The graph indicates the expected coupling loss between the hybrid mode and a low-loss SiN-1 layer as a function of adiabatic taper length. Four curves are plotted. In sequence from left to right, they represent vertical separations between SiN-3 and a bonded SiN-1 layer of 800 nm, 1000 nm, 1200 nm, and 1400 nm.

We calculate that a linear taper 250 µm long would suffer less than 0.1 dB of coupling loss across the nitride layers. It should be noted in this regard that exponential or quadratic tapers often give shorter lengths for the same coupling efficiency. In these calculations, we assume the LN is patterned before bonding, but neither alignment nor etch-surface quality is critical. Other topologies could possibly give low loss coupling while leaving the TFLN intact.

In earlier work, a hybrid TFLN-on-silicon modulator was demonstrated with a 3-dB bandwidth greater than 100 GHz. That work is described in Weigel (2018), cited above.

Also of interest in this regard is Boynton (2020), cited above.

Process flow and heterogeneous integration. The overall process consists of fabricating silicon photonics circuits, bonding those to a silicon carrier and removing the substrate, fabricating III-V (hybrid) lasers on the silicon photonics circuit, and making thermal shunts.

One notable feature that may be included in our process is the bonding of a low-loss silicon nitride layer, as an alternative to growing a silicon nitride layer in situ on a silicon substrate. Another notable feature that may be included is the selective area growth of silicon, which is advantageous for providing relatively thick silicon waveguides that afford better mode control when coupling to III-V material. Yet another notable feature that may be included is processing on a thin buried oxide layer of the SiP substrate, which may offer precision flatness for bonding and integration with the III-V epitaxial structures.

Details of our process flow, in an example embodiment, are provided in the Example section that follows below.

Example

Figure 5:
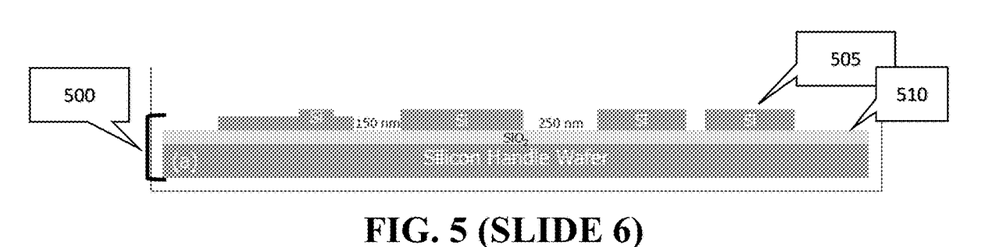
FIGS. 5-13, FIGS. 14A-14D, and FIGS. 15A-15C depict a sequence of stages in an example process flow for making a heterointegrated photonic integrated circuit according to the principles described here.

Turning to FIG. 5, an example process flow begins by providing an SOI wafer 500 with 250-nm-thick silicon layer 505 on 3-µm-thick buried oxide (BOX) layer 510. Alternatively, a thinner BOX layer, for example a layer of 50 nm thickness, could be used. Silicon waveguides and other silicon features are patterned, etched, and oxidized according to CMOS methods known in the art.

Dopants are added to the silicon features as appropriate. For example, devices may be subjected to n-type and p-type doping, contact regions may be subjected to n+ and p+ doping, and avalanche photodiodes may be subjected to p– doping. These processes are conventional and need not be described here in detail.

Figures 6, 7:
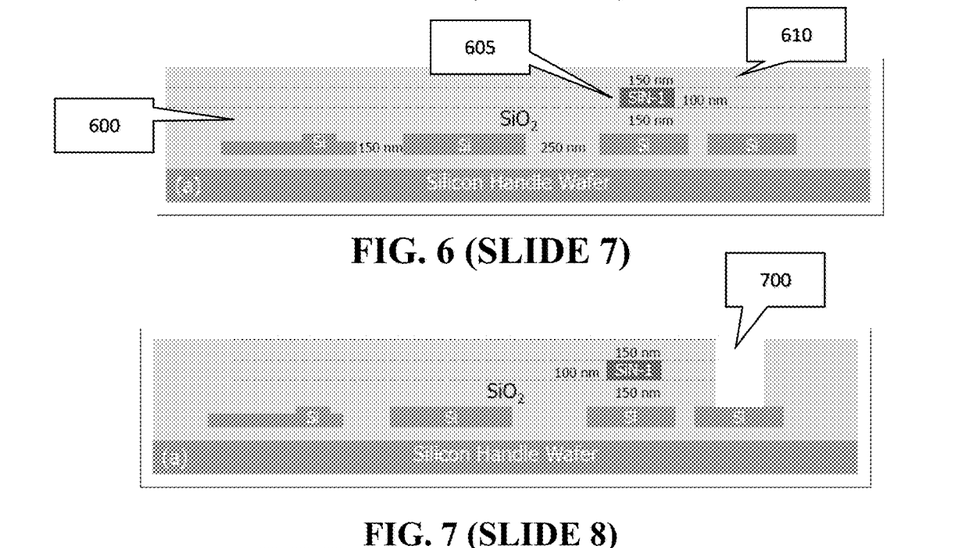

Turning to FIG. 6, silicon dioxide 600 (referred to below as "oxide") is deposited over the silicon to a depth of 800 nm and then reduced to a thickness of 150 nm by chemical-mechanical polishing (CMP).

Silicon nitride (SiN) waveguides 605 are a useful feature for various applications. The initial layer of SiN for waveguide formation, which we refer to as the SiN-1 layer, may be deposited in situ, or it may be introduced by bonding a SiN-bearing wafer. Here, we describe the in situ deposition. An alternative process of bonding the SiN-1 layer is described below.

SiN is deposited to a depth of 100 nm by plasma-enhanced chemical vapor deposition (PECVD). The SiN waveguides are then photolithographically patterned and etched according to known methods. An oxide layer 610 is deposited over the SiN to a depth of 800 nm and reduced to 150 nm by CMP. This brings the top of the oxide layer to the level that will be the top of a germanium avalanche photodetector layer, which will be described next.

Turning to FIG. 7, a hole 700 is etched for each germanium detector through the oxide down to the top of the 250-nm silicon layer for a total depth of 400 nm.

Figure 8:
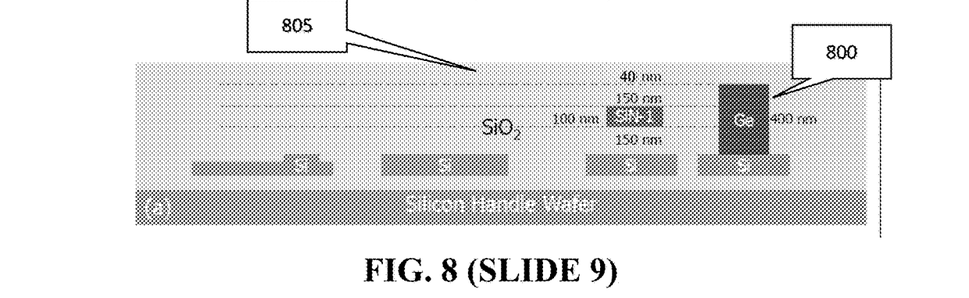

Turning to FIG. 8, the hole is filled by selective epitaxial growth of germanium 800. The excess germanium is then removed from the oxide surface by CMP. A 40-nm cap layer 805 of oxide is then deposited to serve as an implant screen oxide. Arsenic and $BF_2$ implants are performed for n-type and p-type doping, respectively, and the implanted device is annealed.

Figure 9:
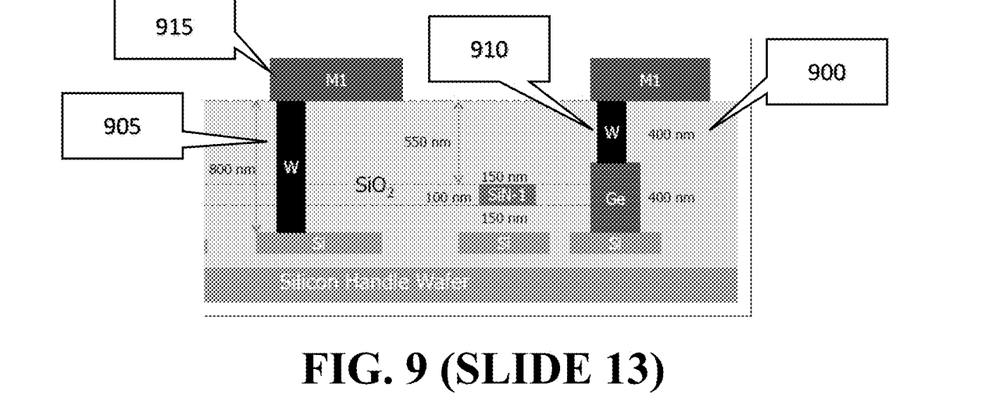

Turning to FIG. 9, a layer 900 of oxide 800 nm thick is deposited and reduced by CMP to a thickness of 400 nm above the germanium layer. A hole is etched through the oxide down to the silicon layer for a tungsten via 905. The tungsten is deposited, and excess tungsten is removed by CMP. In example processes, about 30-50 nm of oxide is also lost in the CMP step. Another hole is etched through the oxide down to the germanium feature and filled with tungsten 910, and excess tungsten is again removed by CMP. A further metal layer 915, designated M1, is then deposited, patterned, and etched to form the metal contacts for the silicon layer and the avalanche photodetector.

Figure 10:
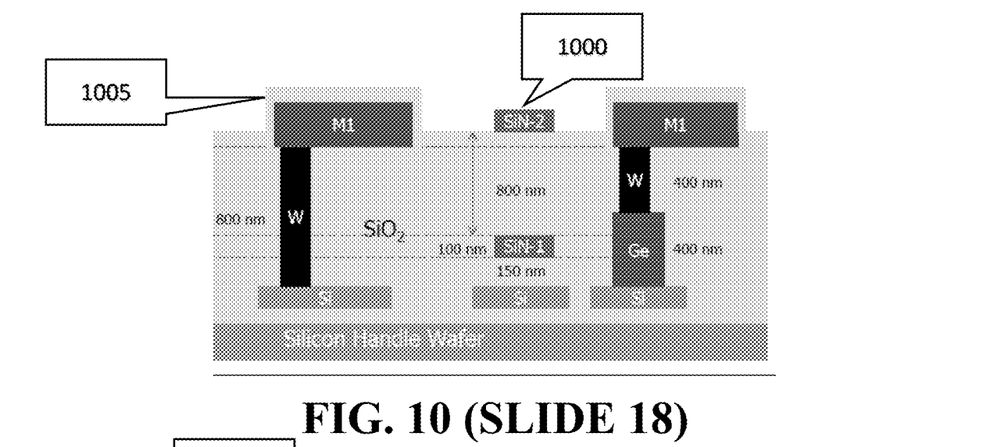

Turning to FIG. 10, after the M1 layer is etched to form contacts for the SiP functional layer, further SiN waveguides 1000, additional to the SiN-1 waveguides, can be provided, for example for optical coupling to the LN layer. First, an oxide layer 1005 of thickness in the range 200-400 nm and exemplarily 250 nm thick, is deposited over the M1 layer. This oxide deposition is followed by CMP. A layer of SiN, referred to here as the SiN-2 layer, is deposited to a depth of 450 nm, photolithographically patterned, and etched to form the second level of SiN waveguides. In the present example, the composition of the SiN-2 layer is silicon-rich silicon nitride, which offers advantages for optical mode control due to higher refractive index.

It should be noted in this regard that the SiN2 layer may have different waveguides with different heights to aid in coupling to the SiN-1 and the SiN3/LN hybrid mode. Some such variability is shown in FIG. 3, which was discussed above, where different SiN levels have different thicknesses, and where some SiN levels are stepped in thickness.

Figure 11:
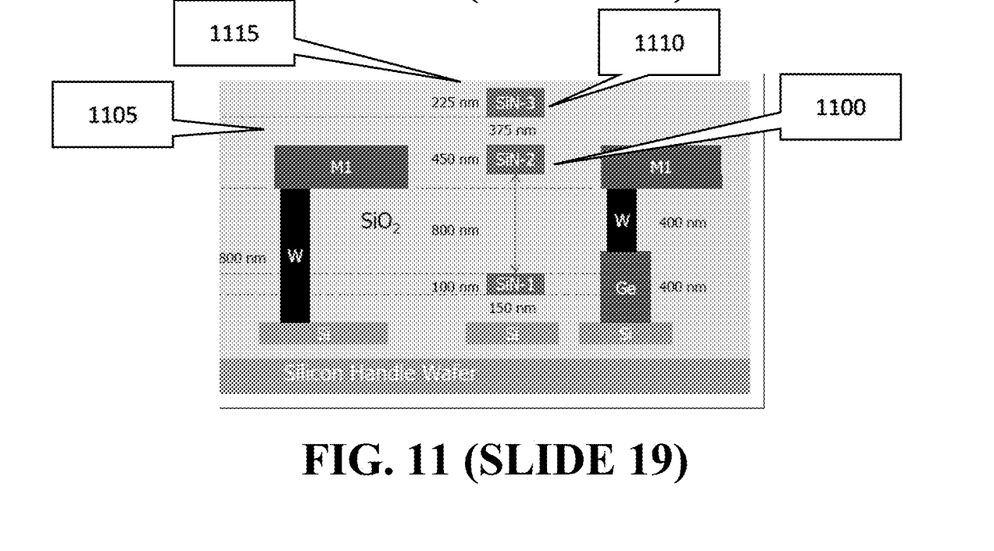

Turning to FIG. 11, a total of three SiN layers are deposited in the present example. Accordingly, after the SiN-2 waveguides 1100 are formed, an oxide layer 1105 is deposited to a depth of 800 nm and reduced by CMP to a depth of 375 nm above the top of the SiN-2 layer. A layer of SiN, referred to here as the SiN-3 layer, is deposited to a depth of 225 nm, photolithographically patterned, and etched to form the SiN-3 waveguides 1110. In the present example, the SiN-3 waveguides are situated within an optical coupling distance of the LN layer, and together with the LN layer they support hybrid optical modes that are confined partly in SiN and partly in LN.

A further oxide layer 1115 is deposited to a depth of 800 nm and reduced by CMP to a thin layer, exemplarily less than 50 nm in thickness. Instead of reducing all the way to the final thickness by CMP, it would also be possible to reduce partway by CMP and perform the final reduction by etching. This last, thin oxide layer is useful to promote bonding between the SiP functional layer and the lithium niobate.

Figure 12:
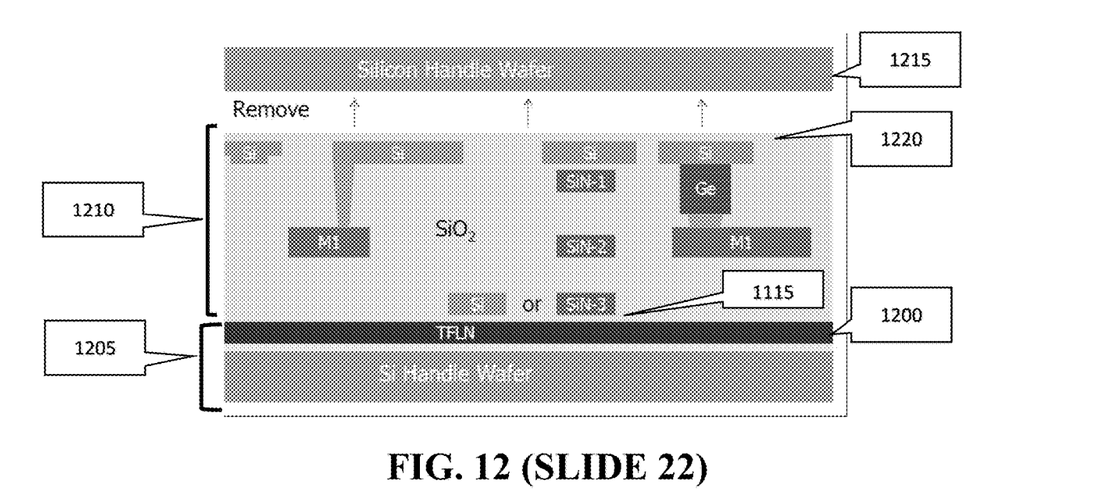

Turning to FIG. 12, the lithium niobate film 1200 is initially provided in the present example as a three-inch, MgO-doped LN-on-insulator (LNOI) wafer 1205. The processed SOI wafer 1210, if larger than three inches in diameter, is resized to match the LNOI wafer. The two wafers are then bonded together with the last, thin layer of oxide 1115 lying between the SiN-3 layer and the layer of LN. We found that the bond can be made at an elevated temperature less than 100° C. with moderate force, and without high-temperature annealing.

A suitable process for bonding the wafers is described in Boynton (2020), cited above. As explained there, the bonding is effectuated at low temperatures where it is realized through van der Waals forces. The bonding surface of the SOI wafer is planarized by CMP to have a targeted RMS roughness less than 10 nm. In examples it is nominally 6 nm. No polishing or planarization steps are performed on the LNOI wafer.

The wafers are cleaned by an SC1 process using H2O: H2O2:NH4OH, 60:4:1, at a temperature of 40° C., with high-frequency ultrasonic cleaning at a power level of 75 W applied for 120 seconds. This is followed by sixty seconds of oxygen plasma activation. This processing removes hydrocarbon particles while increasing silanol Si—OH group densities at the bonding surfaces, which increases the number of bonding sites. Once each bonding surface is cleaned, the bond is initiated by pressing the two samples together with a force of 500 Newtons for twelve hours while applying a thermal anneal of 50° C. to promote covalent bonding.

It is advantageous for the coupling between layers to coarsely etch the lithium niobite thin film to remove the lithium niobate in the coupling regions before bonding. However, it may be possible through appropriate waveguide geometry and refractive index design to dispense with this patterning of the lithium niobate layer.

Next, to prepare the SOI wafer for the bonding of III-V components, the original silicon handle layer 1215 is removed, exposing the BOX 1220 over the back side of the silicon device layer. A suitable oxide thickness is in the range 1-30 nm. If the SOI wafer is originally provided with a thin BOX layer, it may be possible to use the BOX as provided. Otherwise, it can be reduced in thickness by CMP.

The original SOI handle layer can be removed, for example, by back grinding followed by a cleanup etch using the BOX as an etch stop. This provides a surface that is suitably smooth for bonding a III-V layers. After bonding, the III-V layer is processed to form, e.g., active regions for lasers and optical amplifiers.

Because outgassing can interfere with the bonding process, it may be advantageous to pattern the SOI wafer with an array of square holes prior to the bonding.

Figure 13:
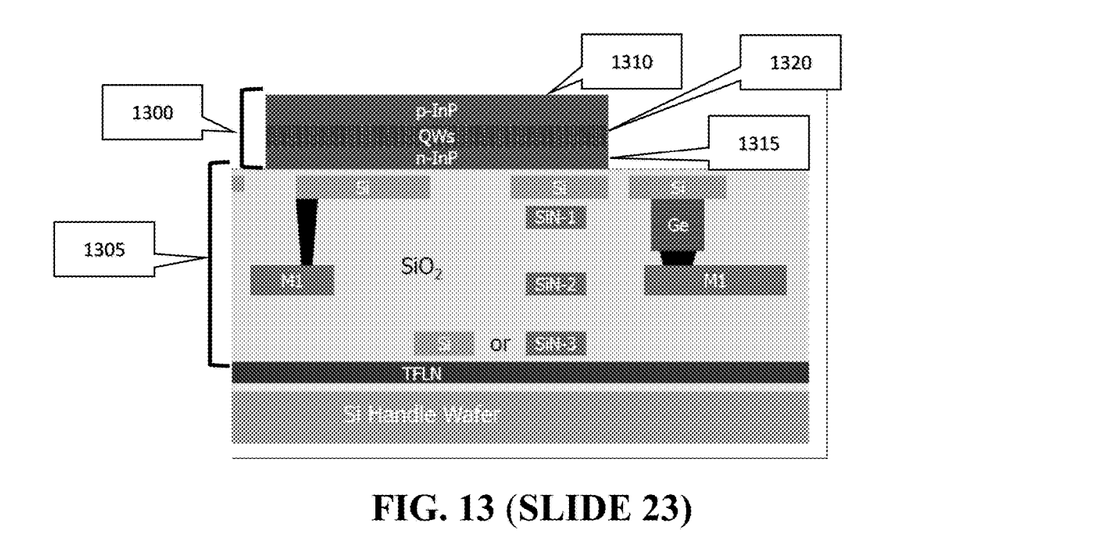

In FIG. 13, the III-V layer 1300 is shown bonded to the processed SOI wafer 1305. An example III-V wafer is a two-inch, epitaxially grown indium phosphide (InP) wafer having n-doped and p-doped InP layers 1310, 1315, respectively, and a multiple quantum well (MQW) structure 1320 interposed between them.

Figure 14A:
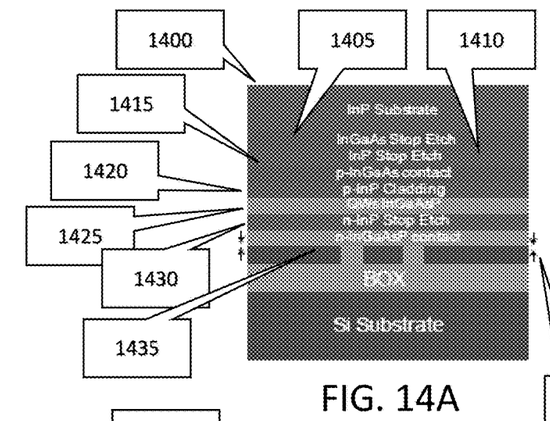

FIG. 14A shows an example III-V wafer in more detail. Such a wafer may include, in sequence, an InP substrate 1400, an InGaAs stop etch layer 1405, an InP stop etch layer 1410, a p-InGaAs contact layer 1415, a p-InP cladding layer 1420, a MQW structure 1425 of InGaAsP, an n-InP stop etch layer 1430, and an n-InGaAsP contact layer 1435. Double arrows 1440 indicate the position where the III-V wafer is bonded to the SOI wafer.

The bonding of the III-V wafer to the SOI wafer begins with a pre-activation cleaning of each wafer. Next is oxygen plasma activation in a reactive ion etcher, followed by post-activation cleaning of each wafer. The wafers are then aligned and manually vacuum-bonded under low pressure at a temperature less than 100° C. which may, e.g., be room temperature, and then annealed at 300° C. for two hours under 6 kN of force.

The well-known SC1 cleaning process (using hydrogen peroxide, ammonium hydroxide, and water) may be used for the pre-activation cleaning of the wafers. In an example, the oxygen plasma activation is conducted for sixty seconds at a radio-frequency power of 19 W and a DC bias of about 200 V in an oxygen flow of 45 SCCM at a pressure of 70 mTorr. For post-activation cleaning, the SOI wafer may be cleaned in dilute aqueous ammonium hydroxide, and the III-V wafer may be subjected again to the SC1 process.

Figure 14B:
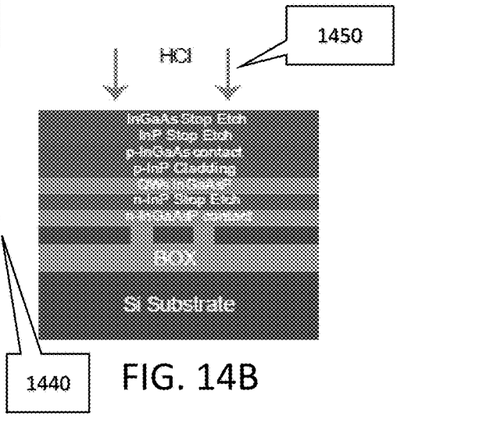
Figure 14C:
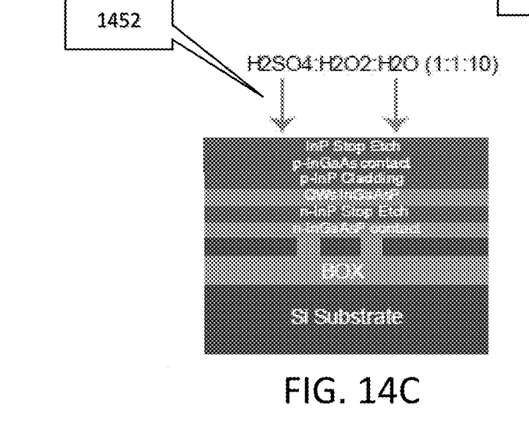
Figure 14D:
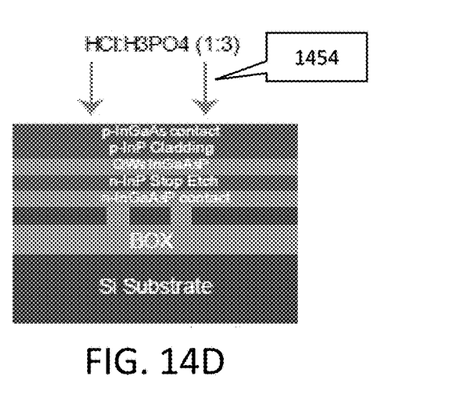

As shown in FIG. 14B, the III-V processing begins with removal of the substrate of the III-V wafer, which as noted above, may be a layer of indium phosphide. In an example, the substrate is removed with a wet etch 1450 using hydrochloric acid, or by back grinding followed by a wet etch. Next, as shown in FIGS. 14C and 14D, the etch-stop layers are removed, exemplarily by etching 1452 with $H_2SO_4$: $H_2O_2$:$H_2O$ (1:1:10) for InGaAs and by etching 1454 with HCl:$H_3PO_4$ (1:3) for InP.

Figure 15A:
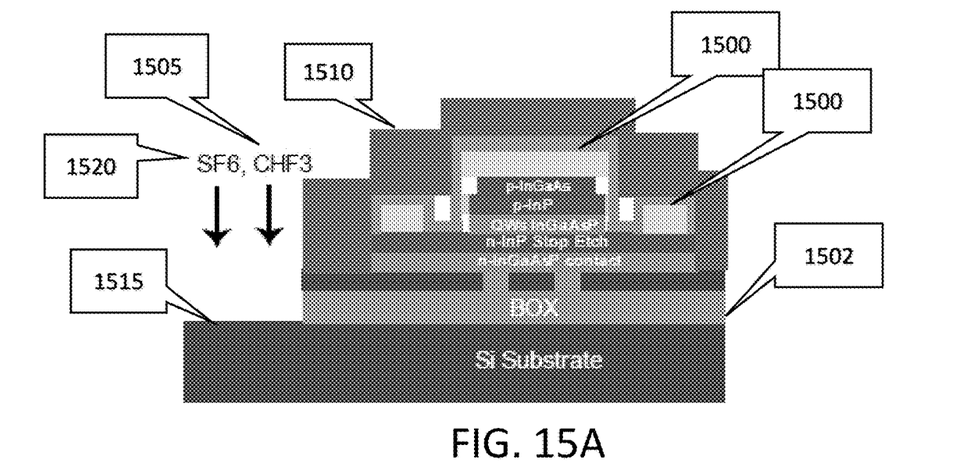

After the etch stops have been removed, lithography and etching operations are performed on the remaining III-V layers to form features such as lasers, waveguide ridges, and waveguide tapers, and then a metal layer M2 is deposited, patterned, and etched to form metal contacts. An example 1500 of M2 contacts is shown in FIG. 15A. These operations are conventional and need not be described here in detail.

In the current example, metal shunts, also referred to here as "thermal vias", are added for the conduction of heat from the III-V functional layer to the silicon substrate of the LNOI wafer, which serves as a heat sink. First, as shown in FIG. 15A, holes are etched from the III-V side down through the oxide 1502 of the SOI wafer. The oxide can be removed, for example, by anisotopic RIE 1505 using $CHF_3$. Protection is provided by photoresist 1510.

If patterning of the LN wafer has previously removed LN from beneath the hole, the hole can be continued partway into the silicon substrate 1515 of the LN wafer. The silicon can be removed, for example, by RIE 1520 using $SF_6$.

If the hole through the oxide terminates at the LN surface, further etching is performed to cut through the LN down to, or down into, the silicon substrate. LN may be removed, for example, by argon ion milling.

Figure 15B:
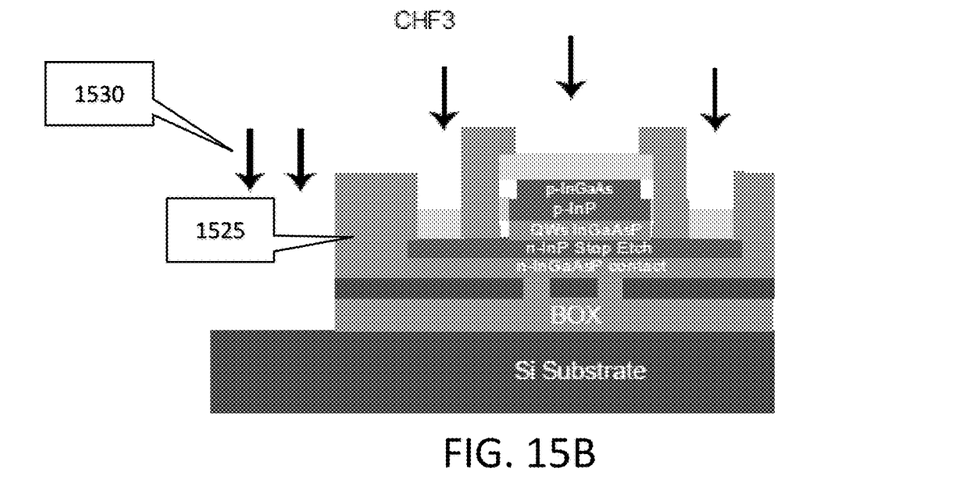

Turning to FIG. 15B, oxide 1525 is deposited next to a depth of 2.4 μm, photolithographically patterned, and etched 1530 to form a mold and foundation for the thermal shunt and plated metal contacts. The etching can be performed, for example, by anisotropic RIE using $CHF_3$.

As explained below, a seed metal will be deposited, and a thicker layer of, e.g., gold will be plated over it to form the thermal shunts. In the example shown in the figures, the thermal shunts are formed over a III-V laser having a p-type mesa and an n-type pedestal. In the conformation defined by the oxide mold and foundation, a shunt contacts the p-type mesa, bridges over the n-type pedestal, and then extends, through a via hole, down to the silicon substrate. Optionally, another shunt may contact a portion of the n-type pedestal and extend through a via hole down to the silicon substrate.

Figure 15C:
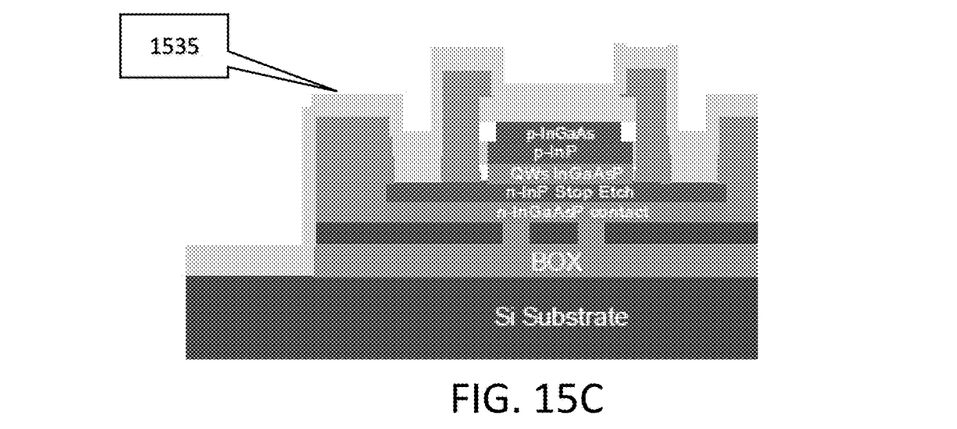

Thus, turning to FIG. 15C, after the oxide structure has been formed, a layer of seed metal for electroplating is deposited. In one example, the seed layer consists of an adhesion layer of titanium 20 nm thick, followed by a gold layer 200 nm thick. Gold 1535 is then electroplated to a thickness of 2-3 μm to form the shunts. It should be noted in this regard that alternative high-thermal-conductivity materials may be used in place of gold. Examples include copper, silver, and CVD diamond.

Lithographic patterning and etching, exemplarily by ME, can be used to remove the seed metal from areas where it is not wanted.

We refer to the metal layer for the thermal shunts as the M3 layer.

The processes for forming the thermal shunts can be performed at temperatures low enough that the III-V components, including lasers, are not affected.

If desired, the M3 metal layer can be used in place of the M1 metal to implement the electrodes for the lithium niobate modulator. Also if desired, the M3 metal can be used to contact the M1 layers.

Top interconnect metal can then be deposited and patterned for contacts to the various devices, including contacts to the shunts. For example, one shunt may be grounded, and another shunt may be connected to a signal such as a bias voltage for a laser.

If desired, the fully processed wafer can then be diced into individual chips. Dicing using a laser rather than a saw blade (so-called "stealth dicing") may be advantageous for giving a smoother and cleaner cut.

After the top interconnect metal has been formed, CMOS circuitry can be added by flip-chip attachment either before or after dicing. By way of example, solder bumps for flip-chip attachment may be made of indium, and the under-bump metal may be Ti/Au. Suitable processes for metal deposition and attachment are conventional and need not be described here in detail.

Additional devices can be added to the top of the circuit, adjacent to the III-V material. The silicon waveguide layer would couple to these other devices. Examples would be YIG-based optical isolators or other magneto-optic devices. Additional devices may be added, for example, at the time of the initial III-V bond or slightly thereafter, as a clean and smooth surface may be available at that time for bonding.

Design variation: Silicon-LN hybrid waveguide. As explained above, SiN waveguides can be situated within an optical coupling distance of the LN layer, where they can support hybrid optical modes. In the example described above, these waveguides are formed in the SiN-3 layer. In an alternative approach, the waveguides that couple directly to the LN layer and support hybrid modes can be composed of silicon instead of SiN.

Figure 16:
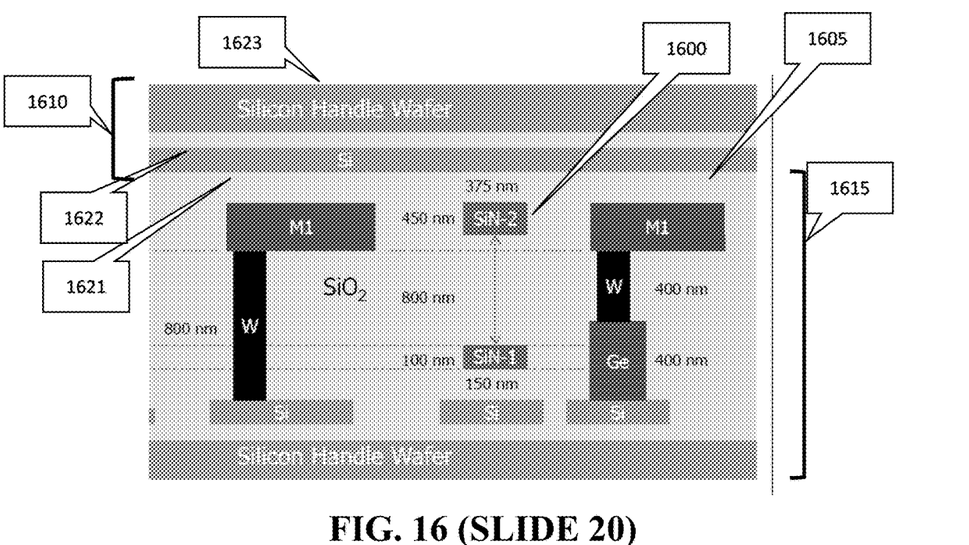
FIG. 16 depicts an alternative stage in a process flow.

Accordingly, in a second example process described now with reference to FIG. 16, the operations described above are performed up to and including forming the SiN-2 waveguides 1600, depositing an oxide layer 1605 to a depth of 800 nm, and reducing the oxide layer to a depth of 375 nm above the top of the SiN-2 layer.

Then, a second SOI wafer 1610, referred to below as the "bonded wafer", is bonded to the processed SOI wafer 1615. The bonded wafer has a silicon device layer 1621, a BOX layer 1622, and a silicon handle 1623. The silicon device layer is bonded to the oxide 1605 above the SiN-2 waveguides.

The superstrate, consisting of the BOX and handle of the bonded wafer, is removed. The remaining silicon device layer of the bonded wafer is then photolithographically patterned and etched to form silicon waveguides. An oxide layer is deposited over the silicon waveguides and reduced by CMP, or by CMP followed by etching, to a depth of 50 nm. Processing then continues as described above.

Design variation: Bonded Silicon Nitride. As noted above, the SiN-1 layer of silicon nitride can be applied by bonding instead of by in situ deposition. The bonding approach offers potential advantages because a separate wafer of LPCVD-grown silicon nitride can be subjected to a high-temperature anneal that would be thermally intolerable to the partially processed SiP wafer. Annealing can reduce the optical loss in the SiN film below what would generally be expected of a film grown in situ.

Figure 17A:
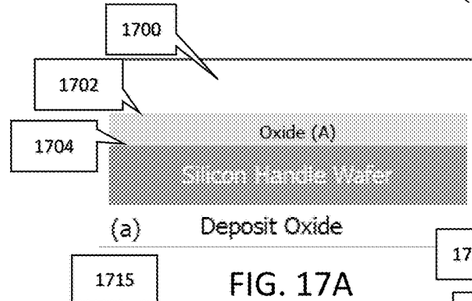
FIGS. 17A-17I depict an alternative sequence of stages in a process flow.
Figure 17B:
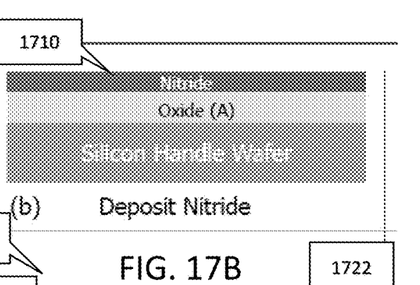
Figures 17C, 17D:
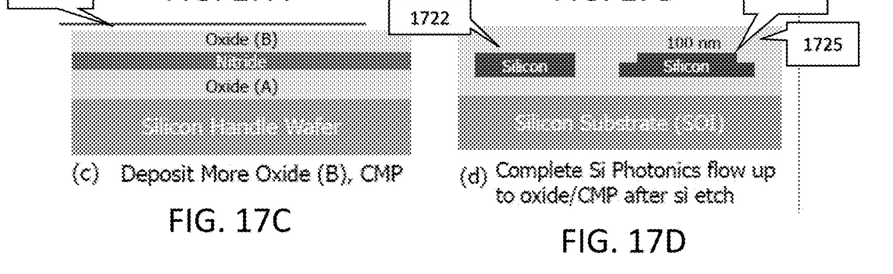

Accordingly, as shown in FIGS. 17A-17C, an SiN wafer 1700 is prepared, by way of example, by forming an oxide layer 1702 on a silicon handle wafer 1704 and depositing the SiN film 1710 over the oxide. An overlayer 1715 of oxide is deposited over the SiN and reduced in thickness by CMP.

Turning to FIG. 17D, the initial SOI wafer 1720 is processed as described above to form and dope the features 1722 in the silicon device layer. Oxide 1725 is deposited over the silicon to a depth of 800 nm and then reduced to a thickness of, e.g., 100 nm by chemical-mechanical polishing (CMP).

Figure 17E:
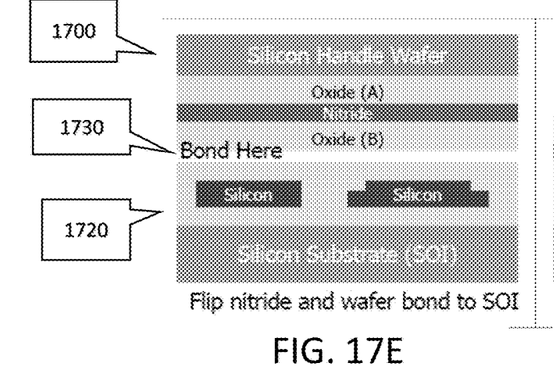

As shown in FIG. 17E, the SiN wafer is flipped over and an oxide-to-oxide bond 1730 is made between the two wafers 1700, 1720.

An example bonding process begins with wafer cleaning, followed by an SC1 cleaning and an inductively coupled plasma (ICP) etch. This is followed by nitrogen plasma activation. A manual bond is then performed under light pressure and low temperature, for example about 200° C.

Figure 17F:
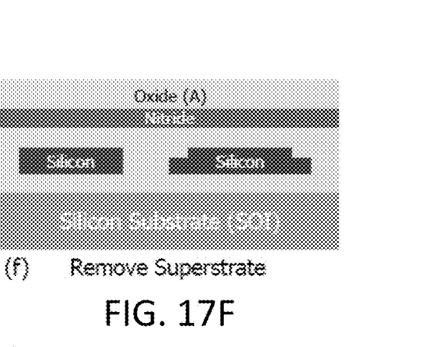
Figure 17G:
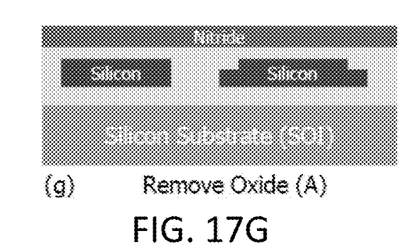

After bonding, as shown in FIGS. 17F and 17G, the silicon handle is removed from the SiN wafer, followed by removal of the oxide layer from the SiN wafer.

Figure 17H:
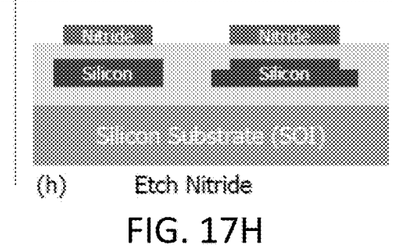
Figure 17I:
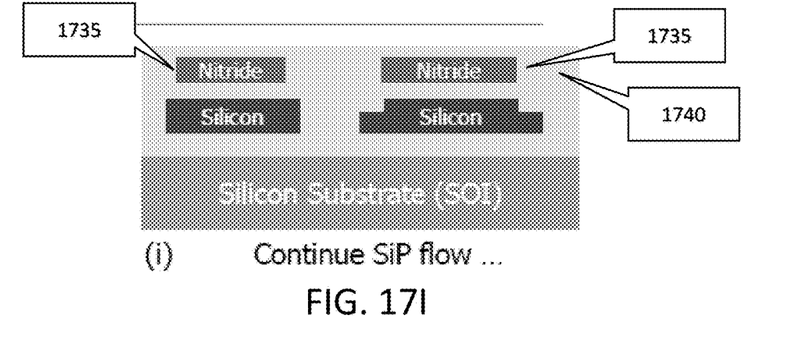

As shown in FIG. 17H, the SiN layer is then photolithographically patterned and etched to form the SiN-1 waveguides 1735. The processing of the SiP functional layer then continues as described above, including adding of oxide 1740 as shown in FIG. 17I.

We claim:

1. A hybrid photonic integrated circuit, comprising:
   a silicon photonics (SiP) functional layer that comprises a top silicon layer, a layer of buried oxide, and at least one optical or optoelectronic component formed in the top silicon layer;
   a thin film of lithium niobate bonded to the SiP functional layer, wherein the thin film of lithium niobate is backed by a silicon handle; and
   at least one III-V die bonded to the layer of buried oxide, wherein the thin film of lithium niobate and the III-V die are positioned on opposing sides of the SiP functional layer;
   wherein the SiP functional layer comprises one or more SiP waveguiding components, a first of the one or more SiP waveguiding components adapted to be optically coupled to a first of the at least one III-V die so as to support a first hybrid optical mode that is partly confined in the first of the at least one III-V die and partly confined in the first of the one or more SiP waveguiding components, the first hybrid optical mode corresponding to light simultaneously traveling in the first of the at least one III-V die and in the first of the one or more SiP waveguiding components in a direction parallel to and at an interface between the SiP functional layer and the first of the at least one III-V die.

2. The hybrid photonic integrated circuit of claim 1, wherein at least one of the one or more SiP waveguiding components is adapted to be optically coupled to the thin film of lithium niobate.

3. The hybrid photonic integrated circuit of claim 1, wherein the SiP functional layer comprises one or more additional waveguiding layers; and
wherein a first of the one or more additional waveguiding layer layers is adapted to be optically coupled to the thin film of lithium niobate so as to support a second hybrid optical mode that is partly confined in lithium niobate material of the thin film of lithium niobate and partly confined in the first of the one or more additional waveguiding layers, the second hybrid optical mode corresponding to light simultaneously traveling in the lithium niobate material of the thin film of lithium niobate and in the first of the one or more additional waveguiding layers in a direction parallel to and at an interface between the SiP functional layer and the thin film of lithium niobate.

4. The hybrid photonic integrated circuit of claim 1, wherein the SiP functional layer comprises one or more silicon nitride waveguiding layers; and
wherein a silicon nitride waveguiding component formed in one of the one or more silicon nitride waveguiding layers is adapted to be optically coupled to the thin film of lithium niobate so as to support a third hybrid optical mode that is confined partly in the thin film of lithium niobate and partly confined in the silicon nitride waveguiding component.

5. The hybrid photonic integrated circuit of claim 1, wherein the SiP functional layer comprises at least two silicon nitride waveguiding layers situated at different vertical levels within the SiP functional layer;
wherein a first of the at least two silicon nitride waveguiding layers comprises a first silicon nitride waveguiding component that is adapted to be optically coupled to the thin film of lithium niobate so as to support a fourth hybrid optical mode that is confined partly in the thin film of lithium niobate and partly confined in the first silicon nitride waveguiding component;
wherein a second of the at least two silicon nitride waveguiding layers is situated at a vertical level between the first of the at least two silicon nitride waveguiding layers and the top silicon layer; and
wherein the second of the at least two silicon nitride waveguiding layers comprises a second silicon nitride waveguiding component that is adapted to be optically coupled both to the first silicon nitride waveguiding component and to a waveguiding component formed in the top silicon layer.

6. The hybrid photonic integrated circuit of claim 1, wherein an active III-V device formed in one of the at least one III-V die is bonded to the layer of buried oxide; and
wherein the hybrid photonic integrated circuit further comprises a thermal shunt that extends from the active III-V device, through the SiP functional layer, and down to or down into the silicon handle.

7. The hybrid photonic integrated circuit of claim 1, wherein the SiP functional layer comprises at least one germanium photodetector.

8. The hybrid photonic integrated circuit of claim 1, wherein at least one active III-V device formed in one of the at least one III-V die is bonded to the layer of buried oxide.

9. A hybrid photonic integrated circuit, comprising:
a silicon photonics (SiP) functional layer that comprises a top waveguiding layer and a layer of buried oxide;
a thin film of lithium niobate bonded to the SiP functional layer, wherein the thin film of lithium niobate is backed by a silicon handle; and
at least one III-V die bonded to the layer of buried oxide, wherein the thin film of lithium niobate and the III-V die are positioned on opposing sides of the SiP functional layer;
wherein the SiP functional layer comprises one or more SiP waveguiding components, a first of the one or more SiP waveguiding components adapted to be optically coupled to a first of the at least one III-V die so as to support a first hybrid optical mode that is partly confined in the first of the at least one III-V die and partly confined in the first of the one or more SiP waveguiding components, the first hybrid optical mode corresponding to light simultaneously traveling in the first of the at least one III-V die and in the first of the one or more SiP waveguiding components in a direction parallel to and at an interface between the SiP functional layer and the first of the at least one III-V die.

10. The hybrid photonic integrated circuit of claim 9, wherein at least one of the one or more SiP waveguiding components is adapted to be optically coupled to the thin film of lithium niobate.

11. The hybrid photonic integrated circuit of claim 9, wherein the SiP functional layer comprises one or more additional waveguiding layers; and
wherein a first of the one or more additional waveguiding layer layers is adapted to be optically coupled to the thin film of lithium niobate so as to support a second hybrid optical mode that is partly confined in lithium niobate material of the thin film of lithium niobate and partly confined in the first of the one or more additional waveguiding layers, the second hybrid optical mode corresponding to light simultaneously traveling in the lithium niobate material of the thin film of lithium niobate and in the first of the one or more additional waveguiding layers in a direction parallel to and at an interface between the SiP functional layer and the thin film of lithium niobate.

12. The hybrid photonic integrated circuit of claim 9, wherein the SiP functional layer comprises one or more silicon nitride waveguiding layers; and
wherein a silicon nitride waveguiding component formed in one of the one or more silicon nitride waveguiding layers is adapted to be optically coupled to the thin film of lithium niobate so as to support a third hybrid optical mode that is confined partly in the thin film of lithium niobate and partly confined in the silicon nitride waveguiding component.

13. The hybrid photonic integrated circuit of claim 9, wherein the SiP functional layer comprises at least two silicon nitride waveguiding layers situated at different vertical levels within the SiP functional layer;
wherein a first of the at least two silicon nitride waveguiding layers comprises a first silicon nitride waveguiding component that is adapted to be optically coupled to the thin film of lithium niobate so as to support a fourth hybrid optical mode that is confined partly in the thin film of lithium niobate and partly confined in the first silicon nitride waveguiding component;

wherein a second of the at least two silicon nitride waveguiding layers is situated at a vertical level between the first of the at least two silicon nitride waveguiding layers and the top silicon layer; and wherein the second of the at least two silicon nitride waveguiding layers comprises a second silicon nitride waveguiding component that is adapted to be optically coupled both to the first silicon nitride waveguiding component and to a waveguiding component formed in the top silicon layer.

14. The hybrid photonic integrated circuit of claim 9, wherein an active III-V device formed in one of the at least one III-V die is bonded to the layer of buried oxide; and wherein the hybrid photonic integrated circuit further comprises a thermal shunt that extends from the active III-V device, through the SiP functional layer, and down to or down into the silicon handle.

15. The hybrid photonic integrated circuit of claim 9, wherein the SiP functional layer comprises at least one germanium photodetector.

16. The hybrid photonic integrated circuit of claim 9, wherein at least one active III-V device formed in one of the at least one III-V die is bonded to the layer of buried oxide.

\* \* \* \* \*